(12) United States Patent
Yamaguchi et al.

(10) Patent No.: US 8,405,064 B2
(45) Date of Patent: Mar. 26, 2013

(54) NITRIDE SEMICONDUCTOR DEVICE

(75) Inventors: Atsushi Yamaguchi, Kyoto (JP);
Norikazu Ito, Kyoto (JP); Shinya Takado, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 161 days.

(21) Appl. No.: 13/067,042

(22) Filed: May 4, 2011

(65) Prior Publication Data

US 2011/0272665 A1 Nov. 10, 2011

(30) Foreign Application Priority Data

May 7, 2010 (JP) ................................. 2010-107296

(51) Int. Cl.
*H01L 29/06* (2006.01)

(52) U.S. Cl. ...................... 257/12; 257/E29.072; 257/15

(58) Field of Classification Search .................... 257/12, 257/15, E29.072
See application file for complete search history.

(56) References Cited

U.S. PATENT DOCUMENTS

| 7,652,282 | B2 | 1/2010 | Yanagihara |
| 7,750,369 | B2 | 7/2010 | Ohta et al. |
| 2006/0192195 | A1* | 8/2006 | Lee .................................. 257/14 |
| 2007/0063207 | A1* | 3/2007 | Tanizawa et al. ................ 257/94 |
| 2008/0203382 | A1 | 8/2008 | Yanagihara |
| 2008/0315256 | A1 | 12/2008 | Ohta et al. |

FOREIGN PATENT DOCUMENTS

| JP | 2003-59948 | 2/2003 |
| JP | 2008-205117 | 9/2008 |
| JP | 2008-218479 | 9/2008 |
| JP | 2008-311355 | 12/2008 |
| JP | 2009-206142 | 9/2009 |

* cited by examiner

*Primary Examiner* — Kimberly Rizkallah
*Assistant Examiner* — Timor Karimy
(74) *Attorney, Agent, or Firm* — Rabin & Berdo, P.C.

(57) ABSTRACT

An inventive nitride semiconductor device includes: a substrate; a first buffer layer provided on the substrate, and having a superlattice structure which includes two types of Group III nitride semiconductor sublayers having different compositions and alternately stacked in pairs; a second buffer layer provided on the first buffer layer in contact with the first buffer layer, and having a superlattice structure which includes two types of Group III nitride semiconductor sublayers having different compositions and alternately stacked in pairs; and a device operation layer of a Group III nitride semiconductor provided on the second buffer layer; wherein an average lattice constant LC1 of the first buffer layer, an average lattice constant LC2 of the second buffer layer and an average lattice constant LC3 of the device operation layer satisfy the following expression (1):

$$LC1<LC2<LC3 \qquad (1).$$

9 Claims, 8 Drawing Sheets

FIG. 4
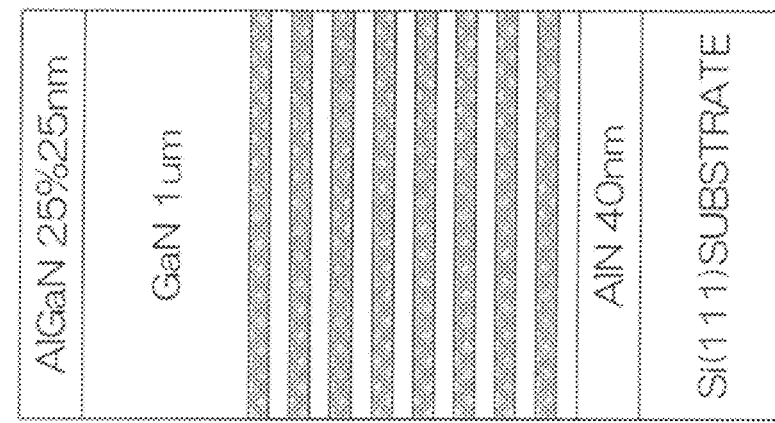
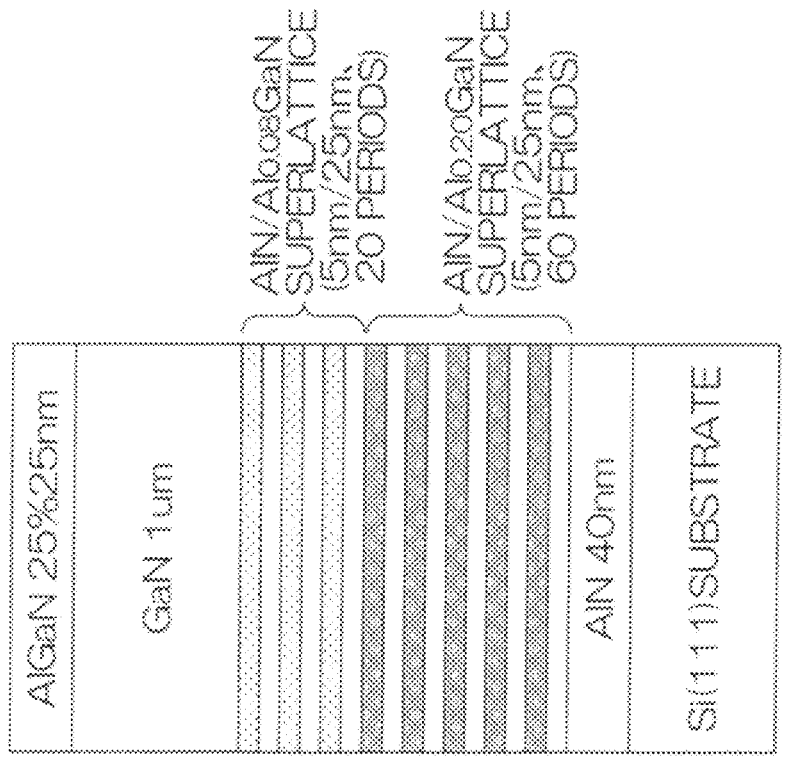

NITRIDE SEMICONDUCTOR DEVICE

BACKGROUND OF THE INVENTION

1. Field of the Invention

The present invention relates to a nitride semiconductor device employing Group III nitride semiconductors.

2. Description of Related Art

Nitride semiconductor devices such as HEMTs (High Electron Mobility Transistors) and MISFETs (Metal Insulator Semiconductor Field Effect Transistors) which employ Group III nitride semiconductors are known to be used as power devices for power amplifier circuits, motor driving circuits and the like.

Such a nitride semiconductor device is produced, for example, by using an epitaxial wafer including a substrate and an epitaxial layer formed on the substrate by epitaxial growth of a Group III nitride semiconductor. The substrate to be used is preferably of the same type as the epitaxial layer, i.e., a Group III nitride semiconductor substrate, for reduction of a difference in linear expansion coefficient between the substrate and the epitaxial layer.

However, the Group III nitride semiconductor substrate is expensive. In recent years, therefore, a different type of substrate such as a Si substrate or a SiC substrate is used instead of the Group III nitride semiconductor substrate. In this case, a buffer layer is provided between the different type substrate and the epitaxial layer. The buffer layer is made of a composition having a lower average lattice constant than the epitaxial layer, thereby relieving the warpage of the epitaxial wafer which may otherwise occur due to an internal stress caused by a difference in linear expansion coefficient between the different type substrate and the epitaxial layer during cooling after the epitaxial growth.

For example, Patent Document 1 (JP-A-2003-59948) discloses a HEMT which includes a Si substrate, a composite buffer layer including $Al_xGa_{1-x}N$ ($0<x\leq1$) sublayers and $Al_yGa_{1-y}N$ ($0<y\leq1$) sublayers alternately stacked and covering the entire major surface of the Si substrate, and a HEMT element semiconductor region including a GaN electron transport layer provided on the buffer layer.

The buffer layer is capable of accommodating (or buffering) the difference in linear expansion coefficient between the Si substrate and the GaN electron transport layer, if having a thickness not greater than a certain thickness (critical thickness). If having a thickness greater than the critical thickness, on the other hand, the buffer layer is liable to experience misfit transition to reduce a stress energy. Thus, the buffer layer experiences lattice relaxation and, therefore, has a lattice constant that is closer to its intrinsic lattice constant. As a result, the buffer layer fails to serve for its intended purpose (to provide the buffering effect). Therefore, a great tensile stress acts on the GaN electron transport layer, resulting in cracking of the GaN electron transport layer.

In the prior art, therefore, the thickness of the buffer layer (the number of periods of $Al_xGa_{1-x}N/Al_yGa_{1-y}N$ of the buffer layer) should be limited. This makes it difficult to improve the breakdown voltage of the device by increasing the thickness of the buffer layer. Such a difficulty is desirably eliminated as far as the properties (e.g., leak current value) of the device are not adversely influenced.

SUMMARY OF THE INVENTION

It is an object of the present invention to provide a nitride semiconductor device which is substantially free from increase in leak current, and substantially free from cracking even if the number of superlattice periods of a Group III nitride semiconductor superlattice structure provided on a substrate is increased.

The foregoing and other objects, features and effects of the present invention will become more apparent from the following detailed description of the preferred embodiments with reference to the attached drawings.

BRIEF DESCRIPTION OF THE DRAWINGS

FIG. 4 is a schematic sectional view showing the structures of HEMTs of Example 1 and Comparative Example 1.

DETAILED DESCRIPTION OF PREFERRED EMBODIMENTS

Figure 1:
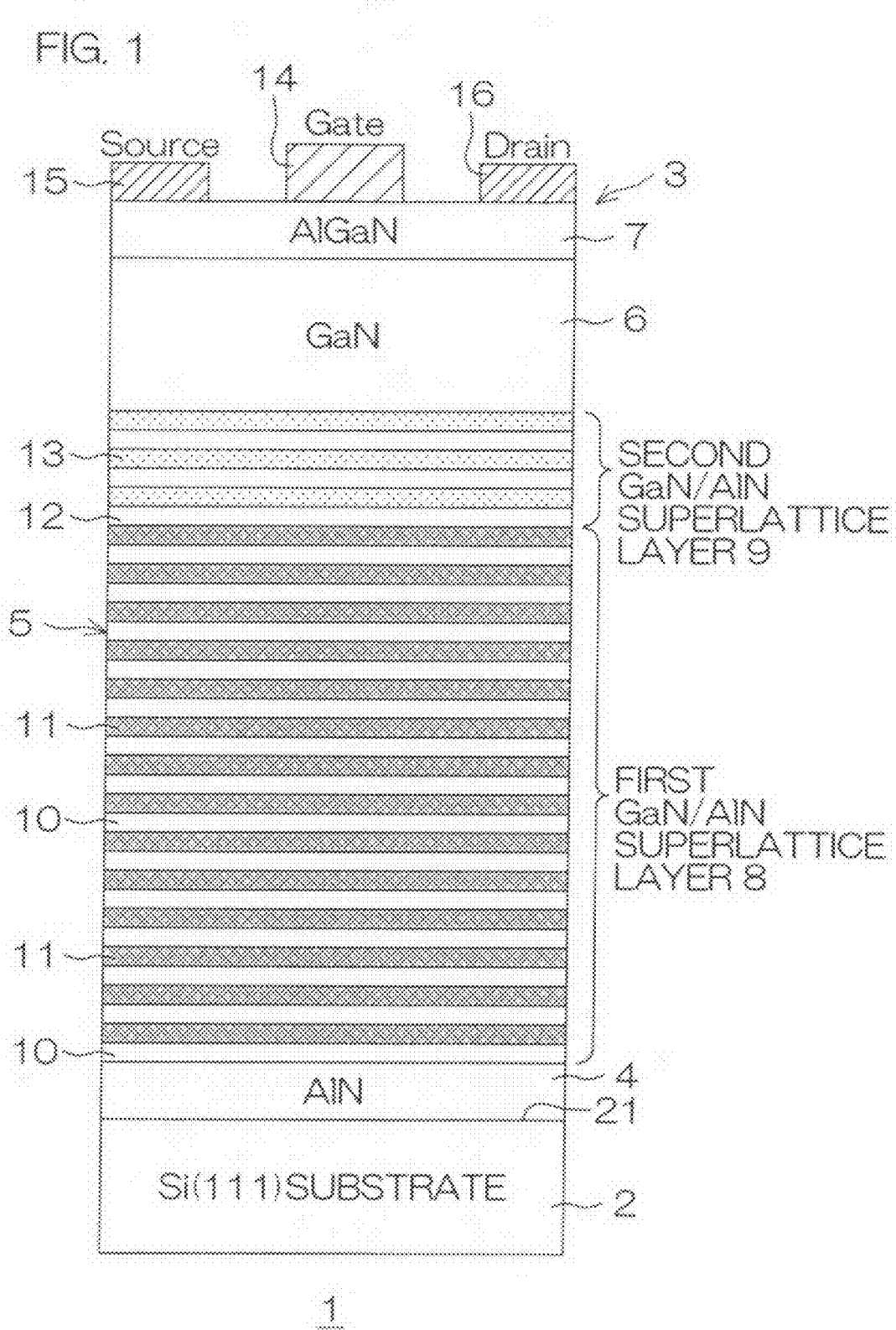
FIG. 1 is a schematic sectional view for explaining the structure of a HEMT according to one embodiment of the present invention.

According to one aspect of the present invention, there is provided a nitride semiconductor device, which includes: a substrate; a first buffer layer provided on the substrate, and having a superlattice structure which includes two types of Group III nitride semiconductor sublayers having different compositions and alternately stacked in pairs; a second buffer layer provided on the first buffer layer in contact with the first buffer layer, and having a superlattice structure which includes two types of Group III nitride semiconductor sublayers having different compositions and alternately stacked in pairs; and a device operation layer of a Group III nitride semiconductor provided on the second buffer layer; wherein an average lattice constant LC1 of the first buffer layer, an average lattice constant LC2 of the second buffer layer and an average lattice constant LC3 of the device operation layer satisfy the following expression (1):

$$LC1<LC2<LC3 \tag{1}$$

Since the average lattice constant LC2 of the second buffer layer provided between the first buffer layer and the device operation layer is intermediate between the average lattice constant LC1 of the first buffer layer and the average lattice constant LC3 of the device operation layer, the second buffer layer functions to accommodate (or buffer) a difference in linear expansion coefficient between the first buffer layer having the average lattice constant LC1 (<LC2) and the device operation layer having the average lattice constant LC3 (>LC2). Therefore, the provision of the second buffer layer between the first buffer layer and the device operation layer makes it possible to maintain the function of accommodating (or buffering) a difference in linear expansion coefficient between the substrate and the device operation layer while reducing the thickness of each of the first and second buffer layers to not greater than a critical thickness even if the total number of superlattice periods of the buffer layers is increased. Thus, the lattice relaxation can be suppressed. As a result, the breakdown voltage of the device can be improved by increasing the thicknesses of the first and second buffer layers within a range not greater than the critical thickness.

Since no other Group III nitride semiconductor layer is provided between the first buffer layer and the second buffer layer, the second buffer layer is stacked on the first buffer layer in contact with the first buffer layer, thereby suppressing increase in leak current.

Further, the first buffer layer may have an $Al_{x1}GaN/Al_{y1}GaN$ superlattice structure ($0 \leq x1 < 1$, $0 < y1 \leq 1$, $x1 < y1$) including $Al_{x1}GaN$ sublayers and $Al_{y1}GaN$ sublayers alternately stacked in pairs, and the second buffer layer may have an $Al_{x2}GaN/Al_{y2}GaN$ superlattice structure ($0 \leq x2 < 1$, $0 < y2 \leq 1$, $x2 < y2$) including $Al_{x2}GaN$ sublayers and $Al_{y2}GaN$ sublayers alternately stacked in pairs.

In this case, the $Al_{x2}GaN$ sublayers of the second buffer layer are preferably thicker than the $Al_{x1}GaN$ sublayers of the first buffer layer, and an Al composition ratio x1 of the $Al_{x1}GaN$ sublayers is preferably greater than an Al composition ratio x2 of the $Al_{x2}GaN$ sublayers.

Further, the first buffer layer preferably has a greater average Al composition ratio than the second buffer layer. The first buffer layer preferably has a greater number of superlattice periods than the second buffer layer.

The substrate may be one of a Si substrate, a SiC substrate and a sapphire substrate.

The device operation layer may include a GaN layer. In this case, the present invention is more effective because the GaN layer is more liable to suffer from leak current.

An AlN layer is preferably provided between the substrate and the first buffer layer. Where the substrate is a Si substrate and the first buffer layer has a GaN/AlN superlattice structure, for example, the Si substrate is liable to suffer from crystal defects in contact with the GaN sublayer due to a reaction between Ga and Si. However, the provision of the AlN layer between the first buffer layer and the substrate prevents the crystal defects.

Embodiments of the present invention will hereinafter be described in detail with reference to the attached drawings.

FIG. 1 is a schematic sectional view for explaining the structure of a HEMT according to one embodiment of the present invention.

The HEMT 1 includes a substrate 2, and a Group III nitride semiconductor layered structure 3 formed on the substrate 2 by epitaxial growth (crystal growth).

In this embodiment, the substrate 2 is a Si monocrystalline substrate (having a linear expansion coefficient a1 of about $2.55 \times 10^{-6}$ (at 293 K)). The substrate 2 has a (111) plane as its major surface 21. Si atoms bonded to constituent atoms of the nitride semiconductor have, for example, a lattice distance LC0 of about 0.3840 nm as measured in the major surface 21 (along an a-axis to be described later). The Group III nitride semiconductor layered structure 3 is formed by crystal growth on the major surface 21. The Group III nitride semiconductor layered structure 3 is formed from Group III nitride semiconductors, for example, each having an m-plane as its major crystal growth plane.

Layers of the Group III nitride semiconductor layered structure 3 are each formed by coherent growth on the substrate 2. The coherent growth means crystal growth which permits lattice continuity between a crystal growth layer and an underlying layer. Lattice mismatch between the crystal growth layer and the underlying layer is accommodated by lattice strain occurring in the crystal growth layer, whereby the lattice continuity is maintained in an interface between the crystal growth layer and the underlying layer. For example, it is assumed that an InGaN layer and an AlGaN layer are each grown on an m-plane of a GaN layer. Without strain, the InGaN layer has a greater average lattice constant (a greater a-axis average lattice constant) than the GaN as measured along the a-axis, so that a compressive stress (compressive strain) occurs along the a-axis in the InGaN layer. Without strain, the AlGaN layer has a smaller a-axis average lattice constant than the GaN layer, so that a tensile stress (tensile strain) occurs along the a-axis in the AlGaN layer.

The Group III nitride semiconductor layered structure 3 includes an AlN layer 4 (having a thickness of 5 nm to 500 nm, e.g., 100 nm), a buffer layer 5 (having a thickness of 0.1 μm to 5.0 μm, e.g., 1.6 μm), and a GaN electron transport layer 6 (having a thickness of 100 nm to 5000 nm, e.g., 2.5 μm) and an AlGaN electron supply layer 7 (having a thickness of 5 nm to 100 nm, e.g., 25 nm) cooperatively serving as a device operation layer. These layers are stacked in the named order from the side of the substrate 2.

The AlN layer 4 prevents contact between the Si monocrystalline substrate 2 and a lowermost GaN sublayer 10 of a first GaN/AlN superlattice layer 8 (to be described later). AlN has an a-axis average lattice constant LC0' of, for example, about 0.3112 nm and a linear expansion coefficient α2 of, for example, $4.15 \times 10^{-6}$ (at 293 K).

The buffer layer 5 includes a first GaN/AlN superlattice layer 8 (first buffer layer) provided on the AlN layer 4 in contact with the AlN layer 4, and a second GaN/AlN superlattice layer 9 (second buffer layer) provided on the first GaN/AlN superlattice layer 8 in contact with the first GaN/AlN superlattice layer 8.

The first GaN/AlN superlattice layer 8 has a superlattice structure including GaN sublayers 10 (each having a thickness of 4 nm to 40 nm, e.g., 20 nm) and AlN sublayers 11 (each having a thickness of 2 nm to 10 nm, e.g., 5 nm) which are alternately stacked a plurality of times (10 to 200 periods, e.g., 50 periods). In this embodiment, more specifically, the relatively thick GaN sublayers 10 and the relatively thin AlN sublayers 11 provided in pairs are alternately stacked in this order from the side of the substrate 2 to provide the first GaN/AlN superlattice layer 8. The first GaN/AlN superlattice layer 8 including the AlN sublayers 11 has an average Al composition ratio of 15 to 75% (e.g., 20%). Further, the first GaN/AlN superlattice layer 8 has an a-axis average lattice constant LC1 of, for example, 3.177 nm to 3.131 nm, and a linear expansion coefficient α3 of, for example, $5.374 \times 10^{-6}$ to $4.510 \times 10^{-6}$ (at 293 K).

The second GaN/AlN superlattice layer 9 has a superlattice structure including GaN sublayers 12 (each having a thickness of 4 nm to 40 nm, e.g., 30 nm) and AlN sublayers 13 (each having a thickness of 2 nm to 10 nm, e.g., 5 nm) which are alternately stacked a plurality of times (5 to 60 periods, e.g., 10 periods). In this embodiment, more specifically, the relatively thick GaN sublayers 12 and the relatively thin AlN sublayers 13 provided in pairs are alternately stacked in this order from the side of the substrate 2 to provide the second GaN/AlN superlattice layer 9. The second GaN/AlN superlattice layer 9 has a smaller number of superlattice periods than the first GaN/AlN superlattice layer 8. A lowermost one of the GaN sublayers 12 contacts an uppermost one of the AlN sublayers 13 of the first GaN/AlN superlattice layer 8. The second GaN/AlN superlattice layer 9 including the AlN sublayers 13 has an average Al composition ratio of 4 to 50% (e.g., 14%). Further, the second GaN/AlN superlattice layer 9 has an a-axis average lattice constant LC2 of, for example, 3.186 nm to 3.151 nm, and a linear expansion coefficient α4 of, for example, $5.532 \times 10^{-6}$ to $4.870 \times 10^{-6}$ (at 293 K).

In this embodiment, the GaN electron transport layer 6 is an undoped GaN layer which is intentionally doped with no impurity (and may contain a trace amount of an impurity). The GaN electron transport layer 6 has an a-axis average lattice constant LC3 of, for example, 0.3157 nm to 0.3221 nm, and a linear expansion coefficient α5 of, for example, about $5.59 \times 10^{-6}$ (at 293 K).

In this embodiment, the AlGaN electron supply layer 7 is an undoped AlGaN layer. The AlGaN electron supply layer 7 has an a-axis average lattice constant LC4 of, for example, 0.3157 nm to 0.3221 nm. The AlGaN electron supply layer 7 has an average Al composition ratio of 10 to 40% (e.g., 25%). The AlGaN electron supply layer 7 has a linear expansion coefficient α6 of, for example, about $4.294 \times 10^{-6}$ to $4.726 \times 10^{-6}$ (at 293 K).

Thus, the GaN layer and the AlGaN layer having different compositions form a hetero junction, so that two-dimensional electron gas (not shown) is generated in a portion of the GaN electron transport layer 6 adjacent to a junction interface between the GaN electron transport layer 6 and the AlGaN electron supply layer 7. The two-dimensional electron gas is present, for example, at a concentration of $5 \times 10^{12}$ to $1 \times 10^{14}$ cm$^{-2}$ in substantially the entire portion of the GaN electron transport layer 6 adjacent to the junction interface between the GaN electron transport layer 6 and the AlGaN electron supply layer 7. The HEMT 1 utilizes the two-dimensional electron gas to cause electric current to flow between a source and a drain to perform a device operation.

A gate electrode 14, a source electrode 15 and a drain electrode 16 are disposed in spaced relation on the AlGaN electron supply layer 7 in contact with the AlGaN electron supply layer 7.

The gate electrode 14 is made of an electrode material, such as Ni/Au (a nickel/gold alloy), which permits formation of a Schottky junction between the gate electrode 14 and the AlGaN electron supply layer 7.

The source electrode 15 and the drain electrode 16 are made of an electrode material which permits formation of an ohmic contact with the AlGaN electron supply layer 7. Examples of such an electrode material include Ti/Al (a titanium/aluminum alloy), Ti/Al/Ni/Au (a titanium/aluminum/nickel/gold alloy), Ti/Al/Nb/Au (a titanium/aluminum/niobium/gold alloy) and Ti/Al/Mo/Au (a titanium/aluminum/molybdenum/gold alloy).

A surface protective film (not shown) may be provided on a surface of the AlGaN electron supply layer 7 to cover the surface. The surface protective film is made of an insulative material such as SiN or $SiO_2$.

Figure 2:
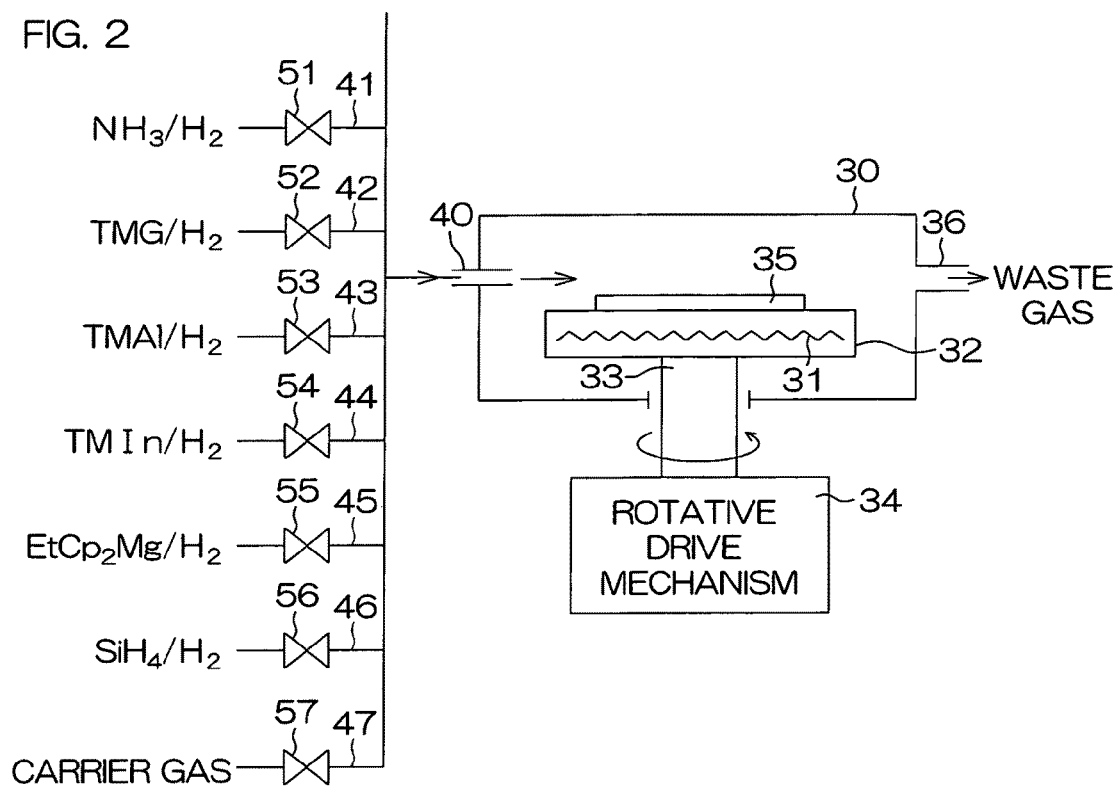
FIG. 2 is a schematic diagram for explaining the construction of a treatment apparatus for growing layers of a Group III nitride semiconductor layered structure.

FIG. 2 is a schematic diagram for explaining the construction of a treatment apparatus for growing the respective layers of the Group III nitride semiconductor layered structure.

A susceptor 32 incorporating a heater 31 is disposed in a treatment chamber 30. The susceptor 32 is connected to a rotation shaft 33, which is rotated by a rotative drive mechanism 34 disposed outside the treatment chamber 30. With this arrangement, a wafer 35 to be treated is held by the susceptor 32, whereby the wafer 35 is heated to a predetermined temperature and rotated in the treatment chamber 30. The wafer 35 is a Si monocrystalline wafer, which forms the aforementioned Si monocrystalline substrate 2.

A waste gas pipe 36 is connected to the treatment chamber 30. The waste gas pipe 36 is connected to a waste gas equipment such as a rotary pump. Thus, the internal pressure of the treatment chamber 30 is maintained at 1/10 atom to an ordinary pressure, and the internal atmosphere of the treatment chamber 30 is constantly vented.

On the other hand, a material gas feed passage 40 is introduced into the treatment chamber 30 for feeding material gases toward a surface of the wafer 35 held by the susceptor 32. A nitrogen material pipe 41 for feeding ammonia as a nitrogen material gas, a gallium material pipe 42 for feeding trimethylgallium (TMG) as a gallium material gas, an aluminum material pipe 43 for feeding trimethylaluminum (TMA1) as an aluminum material gas, an indium material pipe 44 for feeding trimethylindium (TMIn) as an indium material gas, a magnesium material pipe 45 for feeding ethylcyclopentadienylmagnesium (EtCp$_2$Mg) as a magnesium material gas, a silicon material pipe 46 for feeding silane (SiH$_4$) as a silicon material gas and a carrier gas pipe 47 for feeding a carrier gas are connected to the material gas feed passage 40. Valves 51 to 57 are respectively provided in these material pipes 41 to 47. The material gasses are each fed together with the carrier gas, which contains hydrogen and/or nitrogen.

For example, a Si monocrystalline wafer having a (111) plane as its major surface is held as the wafer 35 by the susceptor 32. In this state, the carrier gas is fed into the treatment chamber 30 with the carrier gas valve 57 being open and with the valves 52 to 56 being closed. Further, the heater 31 is turned on to heat the wafer 35 up to a wafer temperature of 900° C. to 1300° C. (e.g., 1050° C.). Thus, Group III nitride semiconductors are each grown without surface roughening.

After the wafer temperature reaches 900° C. to 1300° C., the nitrogen material valve 51 and the aluminum material valve 53 are opened. Thus, ammonia and trimethylaluminum are fed together with the carrier gas from the material gas feed passage 40. As a result, an AlN layer 4 is epitaxially grown on the surface of the wafer 35.

In turn, a first GaN/AlN superlattice layer 8 (first buffer layer) is grown. For the growth of the first GaN/AlN superlattice layer 8, the steps of feeding ammonia and trimethylgallium to the wafer 35 with the nitrogen material valve 51 and the gallium material valve 52 being open to grow a GaN sublayer 10, and feeding ammonia and trimethylaluminum to the wafer 35 with the gallium material valve 52 being closed and with the nitrogen material valve 51 and the aluminum material valve 53 being open to grow an AlN sublayer 11 are alternately performed. More specifically, the GaN sublayer 10 is first formed, and then the AlN sublayer 11 is formed on the GaN sublayer 10. This is repeated, for example, 50 times. During the formation of the first GaN/AlN superlattice layer 8, the wafer 35 is preferably maintained at a wafer temperature of, for example, 900° C. to 1100° C. (e.g., 970° C.).

The growth of the first GaN/AlN superlattice layer 8 is followed by growth of a second GaN/AlN superlattice layer 9. For the growth of the second GaN/AlN superlattice layer 9, the steps of feeding ammonia and trimethylgallium to the wafer 35 with the nitrogen material valve 51 and the gallium material valve 52 being open to grow a GaN sublayer 12, and feeding ammonia and trimethylaluminum to the wafer 35 with the gallium material valve 52 being closed and with the nitrogen material valve 51 and the aluminum material valve 53 being open to grow an AlN sublayer 13 are alternately performed. More specifically, after the formation of the uppermost AlN sublayer 11 of the first GaN/AlN superlattice layer 8, the GaN sublayer 12 is first formed by closing the aluminum material valve 53 and opening the gallium material valve 52, and then the AlN sublayer 13 is formed on the GaN sublayer 12. This is repeated, for example, 10 times. During the formation of the second GaN/AlN superlattice layer 9, the wafer 35 is preferably maintained at a wafer temperature of, for example, 900° C. to 1100° C. (e.g., 970° C.).

After the formation of the uppermost AlN sublayer 13 of the second GaN/AlN superlattice layer 9, the aluminum material valve 53 is closed, and the gallium material valve 52 is opened. Thus, ammonia and trimethylgallium are fed together with the carrier gas from the material gas feed passage 40. As a result, an undoped GaN electron transport layer 6 is epitaxially grown on the uppermost AlN sublayer 13 of the second GaN/AlN superlattice layer 9.

Subsequently, an n-type AlGaN electron supply layer 7 is formed. More specifically, the nitrogen material valve 51, the gallium material valve 52, the aluminum material valve 53 and the silicon material valve 56 are opened, and the other valves 54, 55 are closed. Thus, ammonia, trimethylgallium, trimethylaluminum and silane are fed toward the wafer 35, whereby the n-type AlGaN electron supply layer 7 of silicon-doped AlGaN is formed. During the formation of the n-type AlGaN electron supply layer 7, the wafer 35 is preferably maintained at a wafer temperature of, for example, 900° C. to 1100° C. (e.g., 970° C.).

According to this embodiment, the a-axis average lattice constant LC2 of the second GaN/AlN superlattice layer 9 provided between the first GaN/AlN superlattice layer 8 and the GaN electron transport layer 6 is intermediate between the a-axis average lattice constant LC1 of the first GaN/AlN superlattice layer 8 and the a-axis average lattice constant LC3 of the GaN electron transport layer 6. Therefore, the second GaN/AlN superlattice layer 9 can function to accommodate a difference ($\alpha 3-\alpha 5$) in linear expansion coefficient between the first GaN/AlN superlattice layer 8 having the a-axis average lattice constant LC1 (<LC2) and the GaN electron transport layer 6 having the a-axis average lattice constant LC3 (>LC2).

Therefore, as shown in FIG. 1, the provision of the second GaN/AlN superlattice layer 9 between the first GaN/AlN superlattice layer 8 and the GaN electron transport layer 6 permits accommodation of a difference ($\alpha 1-\alpha 5$) in linear expansion coefficient between the substrate 2 and the GaN electron transport layer 6, and reduces the thicknesses of the first and second GaN/AlN superlattice layers 8, 9 to not greater than the critical thickness even if the total number of superlattice periods of the buffer layer 5 is increased. This suppresses the lattice relaxation. As a result, it is possible to improve the breakdown voltage of the HEMT 1 by increasing the thicknesses of the first and second GaN/AlN superlattice layers 8, 9 within a range not greater than the critical thickness.

With provision of no other Group III nitride semiconductor layer (e.g., without provision of a GaN layer) between the first GaN/AlN superlattice layer 8 and the second GaN/AlN superlattice layer 9, the second GaN/AlN superlattice layer 9 is disposed on the first GaN/AlN superlattice layer 8 in contact with the first GaN/AlN superlattice layer 8. This suppresses increase in leak current. The effect of suppressing the increase in leak current is remarkable when the electron transport layer 6 of the HEMT 1 is made of GaN which is more liable to suffer from leak current.

If the lowermost GaN layer 10 of the first GaN/AlN superlattice layer 8 were in contact with the Si monocrystalline substrate 2, crystal defects would occur in the Si monocrystalline substrate 2 due to a reaction between Ga and Si. In the HEMT 1, however, the AlN layer 4 is provided between the first GaN/AlN superlattice layer 8 and the substrate 2, thereby preventing the crystal defects.

While one embodiment of the present invention has thus been described, the invention may be embodied in other ways.

Figure 3:
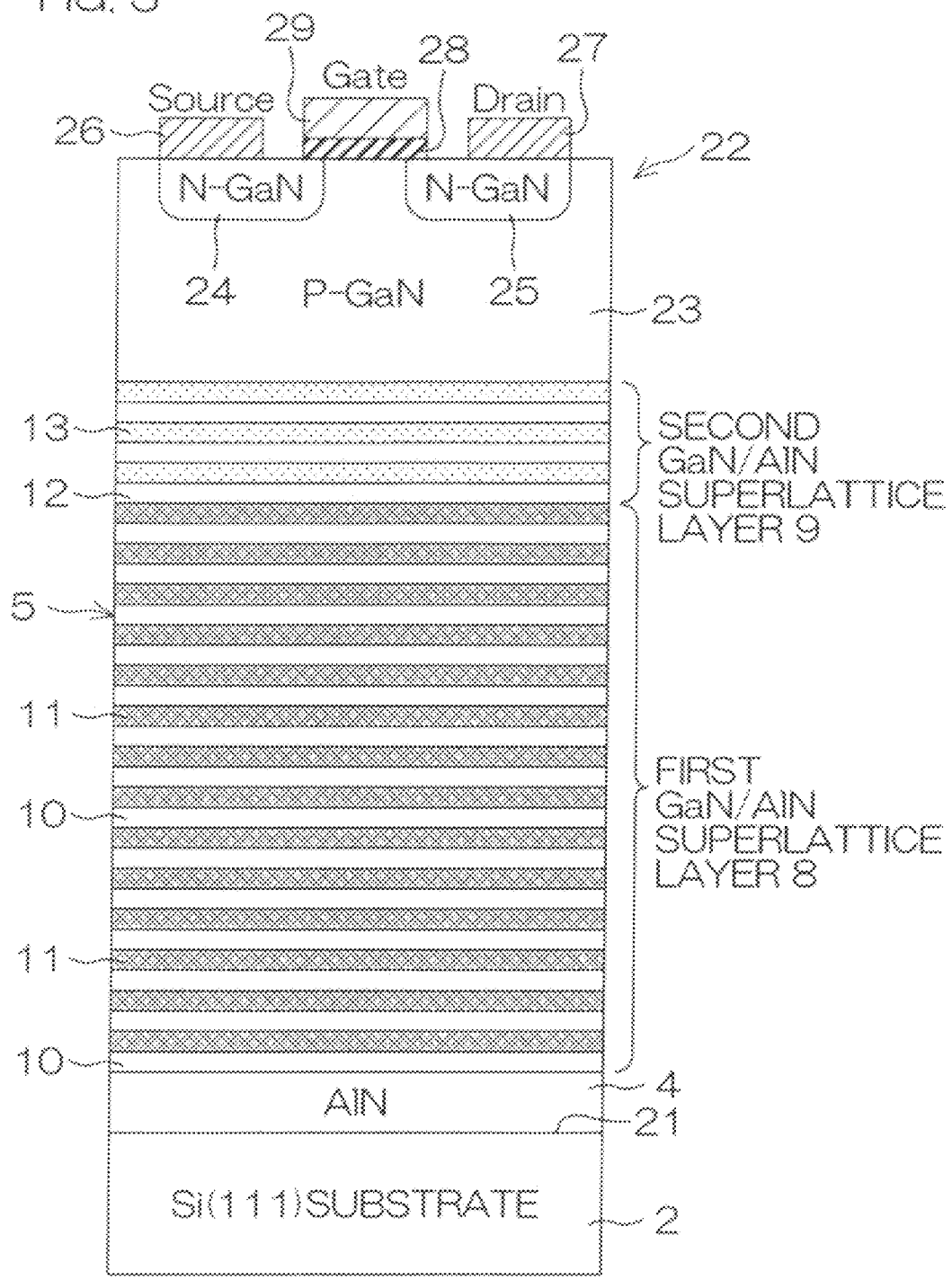
FIG. 3 is a schematic sectional view for explaining the structure of a MISFET according to another embodiment of the present invention.

Although the embodiment of the present invention described above is directed to the HEMT 1 by way of example, the present invention may be embodied as a MISFET 20 according to another embodiment as shown in FIG. 3.

A Group III nitride semiconductor layered structure 22 of the MISFET 20 includes an AlN layer 4, a buffer layer 5, and a p-type GaN channel layer 23 (having a thickness of 300 to 3000 nm, e.g., 1.5 μm) as a device operation layer, which are provided in this order on a substrate 2. An n-type GaN source region 24 and an n-type GaN drain region 25 are provided in spaced relation in a surface portion of the p-type GaN channel layer 23. A source electrode 26 and a drain electrode 27 respectively form ohmic contacts with these regions 24 and 25. A gate electrode 29 is opposed to a surface portion of the p-type GaN channel layer 23 between the n-type GaN source region 24 and the n-type GaN drain region 25 via a gate insulation film 28. In FIG. 3, components corresponding to those shown in FIG. 1 are denoted by the same reference characters as in FIG. 1.

A SiC substrate (e.g., a SiC substrate having an m-plane as its major surface) or a sapphire substrate (e.g., a sapphire substrate having an m-plane as its major surface) may be employed instead of the Si monocrystalline substrate as the substrate 2.

A superlattice structure of the buffer layer 5 provided on the side of the substrate 2 is not limited to the GaN/AlN superlattice structure, but may be a superlattice structure having a composition represented by $Al_{x1}GaN/Al_{y1}GaN$ ($0 \leq x1 < 1$, $0 < y1 \leq 1$, $x1 < y1$) and including $Al_{x1}GaN$ sublayers and $Al_{y1}GaN$ sublayers alternately stacked in pairs. Specific examples of the $Al_{x1}GaN/Al_{y1}GaN$ superlattice structure include an AlGaN/AlGaN superlattice layer. Further, a superlattice structure of the buffer layer 5 provided on the side of the substrate 2 may be an AlN/AlGaN superlattice layer. Similarly, a superlattice structure of the buffer layer 5 provided on the side of the electron transport layer 6 is not limited to the GaN/AlN superlattice structure, but may be a superlattice structure having a composition represented by $Al_{x2}GaN/Al_{y2}GaN$ ($0x2 < 1$, $0 < y2 \leq 1$, $x2 < y2$) and including $Al_{x2}GaN$ sublayers and $Al_{y2}GaN$ sublayers alternately stacked in pairs. Specific examples of the $Al_{x2}GaN/Al_{y2}GaN$ superlattice structure include an AlGaN/AlGaN superlattice layer. Further, a superlattice structure of the buffer layer 5 provided on the side of the electron transport layer 6 may be an AlN/AlGaN superlattice layer.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2010-107296 filed in the Japanese Patent Office on May 7, 2010, the disclosure of which is incorporated herein by reference in its entirety.

EXAMPLES

Next, inventive examples will be described in conjunction with comparative examples. However, it should be understood that the present invention be not limited to the following examples.

1. Example 1 and Comparative Example 1

Example 1 and Comparative Example 1 are intended to demonstrate that the present invention provides the effect of suppressing the lattice relaxation and the effect of improving the breakdown voltage.

(1) Example 1

First, an AlN layer (having a thickness of 40 nm) was epitaxially grown on a surface of a Si substrate having a (111) plane as its major surface. Then, the step of forming an AlN sublayer (having a thickness of 5 nm) and forming an AlGaN sublayer (having a thickness of 25 nm) on the AlN sublayer was repeatedly performed 60 times, whereby an AlN/AlGaN superlattice layer (including 60 periods of AlN/AlGaN) was formed. In the formation of the AlGaN sublayer, the Al composition ratio of the AlGaN sublayer was controlled to be 20%. The AlN/AlGaN superlattice layer thus formed totally had an average Al composition ratio of 33.3%.

Subsequently, the step of forming an AlN sublayer (having a thickness of 5 nm) and forming an AlGaN sublayer (having a thickness of 25 nm) on the AlN sublayer was repeatedly performed 20 times, whereby an AlN/AlGaN superlattice layer (including 20 periods of AlN/AlGaN) was formed. In the formation of the AlGaN sublayer, the Al composition ratio of the AlGaN sublayer was controlled to be 8%. The AlN/AlGaN superlattice layer thus formed totally had an average Al composition ratio of 23.3%.

Thereafter, a GaN layer (having a thickness of 1 μm) and an AlGaN layer (having an Al composition ratio of 25% and a thickness of 25 nm) were formed in this order on the upper AlN/AlGaN superlattice layer. Thus, a Group III nitride semiconductor layered structure was produced.

(2) Comparative Example 1

First, an AlN layer (having a thickness of 40 nm) was epitaxially grown on a surface of a Si substrate having a (111) plane as its major surface. Then, the step of forming an AlN sublayer (having a thickness of 5 nm) and forming an AlGaN sublayer (having a thickness of 25 nm) on the AlN sublayer was repeatedly performed 80 times, whereby an AlN/AlGaN superlattice layer (including 80 periods of AlN/AlGaN) was formed. In the formation of the AlGaN sublayer, the Al composition ratio of the AlGaN sublayer was controlled to be 21%. The AlN/AlGaN superlattice layer thus formed totally had an average Al composition ratio of 34.2%.

Thereafter, a GaN layer (having a thickness of 1 μm) and an AlGaN layer (having an Al composition ratio of 25% and a thickness of 25 nm) were formed in this order on the AlN/AlGaN superlattice layer. Thus, a Group III nitride semiconductor layered structure was produced.

(3) Measurement of c-Axis Strain Amount

The amount of a strain occurring along a c-axis in the GaN layer provided on the superlattice layer of each of the Group III nitride semiconductor layered structures of Example 1 and Comparative Example 1 was measured by means of X'PertMRD available from Philips Corporation. The results are shown in FIG. 5.

Figure 5:
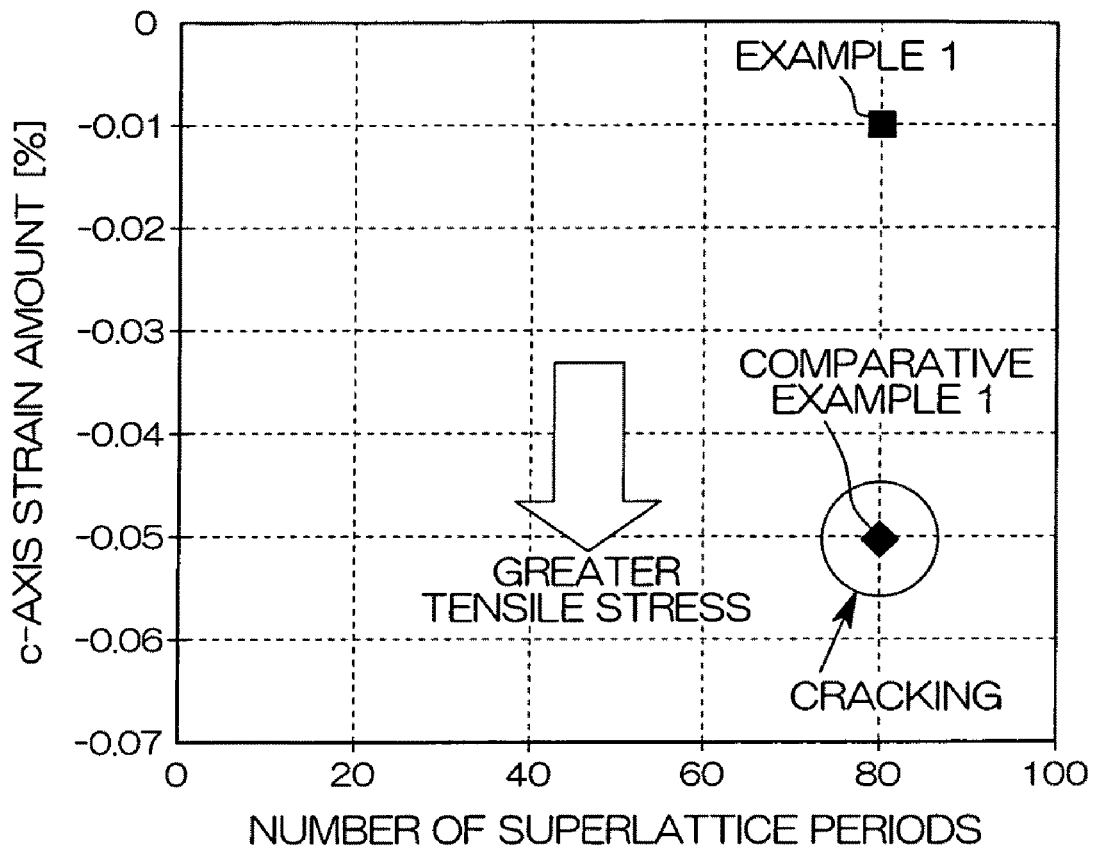
FIG. 5 is a graph showing a relationship between a c-axis strain amount and the number of superlattice periods for demonstrating the effect of suppressing the lattice relaxation.

As shown in FIG. 5, the c-axis strain amount was −0.01% (a stress occurs to cause a −0.01% strain along the c-axis, and a tensile stress occurs along an a-axis) in Example 1. On the other hand, the c-axis strain amount was −0.05% (a stress occurs to cause a −0.05% strain along the c-axis, and a tensile stress occurs along an a-axis), and cracks were observed in the GaN layer in Comparative Example 1.

In Comparative Example 1, the AlN/AlGaN superlattice layer suffered from lattice relaxation supposedly because the thickness of the AlN/AlGaN superlattice layer was increased to greater than the critical thickness by continuously stacking 80 periods of the AlN/AlGaN unit.

In Example 1, on the other hand, the lattice relaxation was suppressed supposedly because the AlN/AlGaN superlattice layers having different average Al composition ratios were formed by stacking 60 periods of AlN/AlGaN and 20 periods of AlN/AlGaN, respectively, to reduce the thickness of each of the AlN/AlGaN superlattice layers to not greater than the critical thickness though the buffer layer totally had the same number of superlattice periods as in Comparative Example 1.

(4) Measurement of Breakdown Voltage

Group III nitride semiconductor layered structures were produced with their buffer layers totally including 20, 60 and 80 superlattice periods, respectively. The Group III nitride semiconductor layered structures included the same sublayer units as in Example 1.

Then, a voltage was applied to the AlGaN sublayer of each of the Group III nitride semiconductor layered structures thus produced, and a voltage level at which the AlN/AlGaN superlattice layer experienced dielectric breakdown was determined. The results are shown in FIG. 6.

Figure 6:
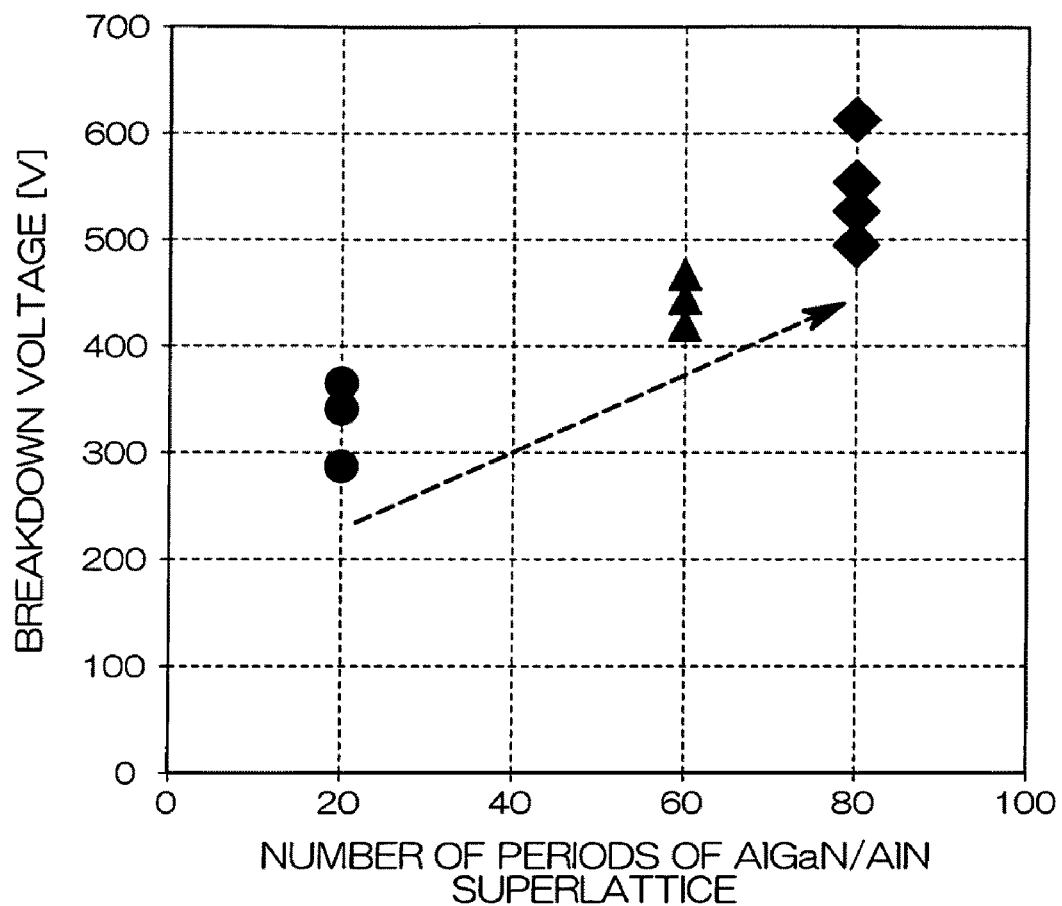
FIG. 6 is a graph showing a relationship between a breakdown voltage and the number of superlattice periods for demonstrating the effect of improving the breakdown voltage.
Figure 7:
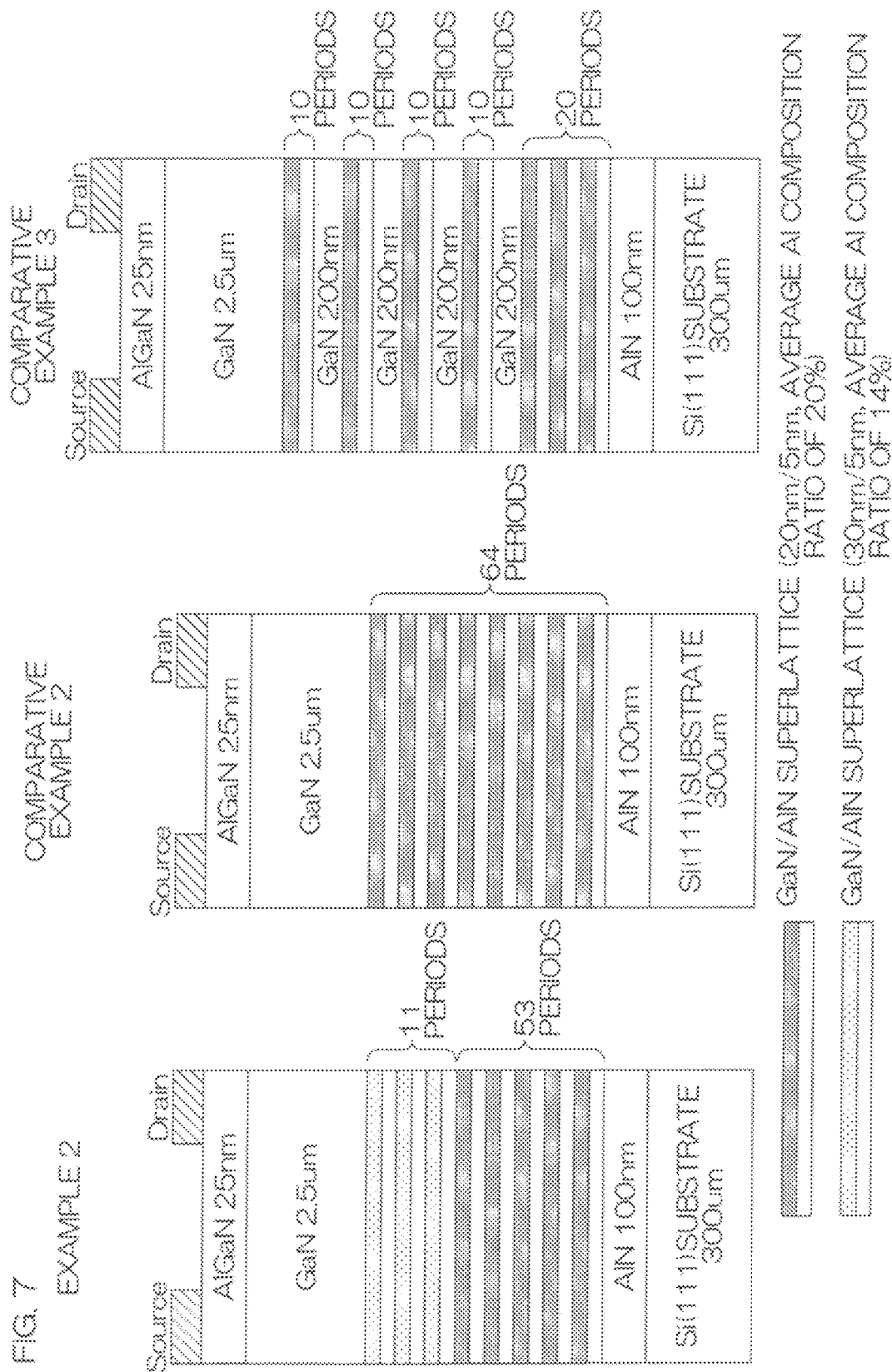
FIG. 7 is a schematic sectional view showing the structures of HEMTs of Example 2 and Comparative Examples 2 and 3.

As shown in FIG. 6, it was confirmed that field concentration on the AlN/AlGaN superlattice layer is more effectively suppressed to improve the breakdown voltage of the Group III nitride semiconductor layered structure, as the number of superlattice periods of the buffer layer (AlN/AlGaN superlattice layer) is increased.

2. Example 2 and Comparative Examples 2 and 3

Example 2 and Comparative Example 2 and 3 are intended to demonstrate that the present invention provides the effect of suppressing the leak current.

(1) Example 2

First, an AlN layer (having a thickness of 100 nm) was epitaxially grown on a surface of a Si substrate (having a thickness of 300 μm) having a (111) plane as its major surface. Then, the step of forming a GaN sublayer (having a thickness of 20 nm) and forming an AlN sublayer (having a thickness of 5 nm) on the GaN sublayer was repeatedly performed 53 times, whereby a GaN/AlN superlattice layer (including 53 periods of GaN/AlN) was formed. The GaN/AlN superlattice layer thus formed totally had an average Al composition ratio of 20%.

Subsequently, the step of forming a GaN sublayer (having a thickness of 30 nm) and forming an AlN sub layer (having a thickness of 5 nm) on the GaN sublayer was repeatedly performed 11 times, whereby a GaN/AlN superlattice layer (including 11 periods of GaN/AlN) was formed. The GaN/AlN superlattice layer thus formed totally had an average Al composition ratio of 14%.

Thereafter, a GaN layer (having a thickness of 2.5 μm) and an AlGaN layer (having an Al composition ratio of 25% and a thickness of 25 nm) were formed in this order on the upper GaN/AlN superlattice layer. Thus, a Group III nitride semiconductor layered structure was produced.

Subsequently, a source electrode and a drain electrode were formed from Ti/Al/Ni/Au on a surface of the AlGaN layer.

(2) Comparative Example 2

First, an AlN layer (having a thickness of 100 nm) was epitaxially grown on a surface of a Si substrate (having a thickness of 300 μm) having a (111) plane as its major surface. Then, the step of forming a GaN sublayer (having a thickness of 20 nm) and forming an AlN sublayer (having a thickness of 5 nm) on the GaN sublayer was repeatedly performed 64 times, whereby a GaN/AlN superlattice layer (including 64 periods of GaN/AlN) was formed. The GaN/AlN superlattice layer thus formed totally had an average Al composition ratio of 20%.

Thereafter, a GaN layer (having a thickness of 2.5 μm) and an AlGaN layer (having an Al composition ratio of 25% and a thickness of 25 nm) were formed in this order on the GaN/AlN superlattice layer. Thus, a Group III nitride semiconductor layered structure was produced.

Subsequently, a source electrode and a drain electrode were formed from Ti/Al/Ni/Au on a surface of the AlGaN layer.

(3) Comparative Example 3

First, an AlN layer (having a thickness of 100 nm) was epitaxially grown on a surface of a Si substrate (having a thickness of 300 μm) having a (111) plane as its major surface. Then, the step of forming a GaN sublayer (having a thickness of 20 nm) and forming an AlN sublayer (having a thickness of 5 nm) on the GaN sublayer was repeatedly performed 20 times, whereby a GaN/AlN superlattice layer (including 20 periods of GaN/AlN) was formed. The GaN/AlN superlattice layer thus formed totally had an average Al composition ratio of 20%.

Subsequently, a single GaN layer (having a thickness of 200 nm) was formed, and then another GaN/AlN superlattice layer (including 10 periods of GaN/AlN (20 nm/5 nm) and having an average Al composition ratio of 20%) was formed on the GaN layer in the same manner as described above. The step of forming a unit including the single GaN layer and the GaN/AlN superlattice layer was repeated three times. Thereafter, a single GaN layer (having a thickness of 200 nm) was formed. Then, the step of forming a GaN sublayer (having a thickness of 30 nm) and forming an AlN sublayer (having a thickness of 5 nm) on the GaN sublayer was repeatedly performed ten times, whereby further another GaN/AlN superlattice layer (including 10 periods of GaN/AlN) was formed. The GaN/AlN superlattice layer thus formed totally had an average Al composition ratio of 14%.

Thereafter, a GaN layer (having a thickness of 2.5 μm) and an AlGaN layer (having an Al composition ratio of 25% and a thickness of 25 nm) were formed in this order on the GaN/AlN superlattice layer (including a unit of GaN/AlN (30 nm/5 nm) and having an average Al composition ratio of 14%). Thus, a Group III nitride semiconductor layered structure was produced.

Subsequently, a source electrode and a drain electrode were formed from Ti/Al/Ni/Au on a surface of the AlGaN layer.

(4) Measurement of Leak Current

Figure 8:
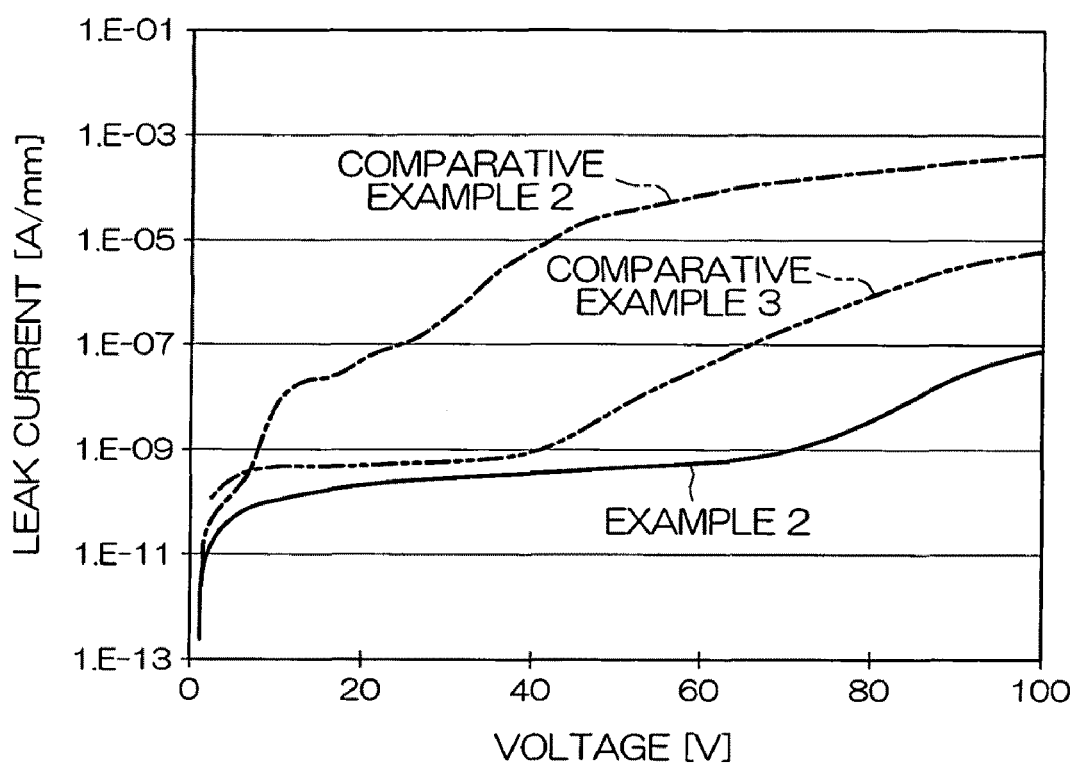
FIG. 8 is a graph showing a relationship between a leak current value and an applied voltage for demonstrating the effect of suppressing the leak current.

A voltage was applied between the source electrode and the drain electrode of each of the Group III nitride semiconductor layered structures of Example 2 and Comparative Examples 2 and 3, and the voltage was gradually increased. Changes in leak current observed during the increase of the voltage are shown in FIG. 8.

What is claimed is:

1. A nitride semiconductor device comprising:
a substrate;
a first buffer layer provided on the substrate, and having a superlattice structure which includes two types of Group III nitride semiconductor sublayers having different compositions and alternately stacked in pairs;
a second buffer layer provided on the first buffer layer in contact with the first buffer layer, and having a superlattice structure which includes two types of Group III nitride semiconductor sublayers having different compositions and alternately stacked in pairs; and
a device operation layer of a Group III nitride semiconductor provided on the second buffer layer;
wherein an average lattice constant LC1 of the first buffer layer, an average lattice constant LC2 of the second buffer layer and an average lattice constant LC3 of the device operation layer satisfy the following expression (1):

$$LC1<LC2<LC3. \tag{1}$$

2. The nitride semiconductor device according to claim 1, wherein the first buffer layer has an $Al_{x1}GaN/Al_{y1}GaN$ superlattice structure ($0 \leq x1 < 1$, $0 < y1 \leq 1$, $x1 < y1$) including $Al_{x1}GaN$ sublayers and $Al_{y1}GaN$ sublayers alternately stacked in pairs,
wherein the second buffer layer has an $Al_{x2}GaN/Al_{y2}GaN$ superlattice structure ($0 \leq x2 < 1$, $0 < y2 \leq 1$, $x2 < y2$) including $Al_{x2}GaN$ sublayers and $Al_{y2}GaN$ sublayers alternately stacked in pairs.

3. The nitride semiconductor device according to claim 2, wherein the $Al_{x2}GaN$ sublayers of the second buffer layer are thicker than the $Al_{x1}GaN$ sublayers of the first buffer layer.

4. The nitride semiconductor device according to claim 2, wherein an Al composition ratio x1 of the $Al_{x1}GaN$ sublayers is greater than an Al composition ratio x2 of the $Al_{x2}GaN$ sublayers.

5. The nitride semiconductor device according to claim 1, wherein the first buffer layer has a greater average Al composition ratio than the second buffer layer.

6. The nitride semiconductor device according to claim 1, wherein the first buffer layer has a greater number of superlattice periods than the second buffer layer.

7. The nitride semiconductor device according to claim 1, wherein the substrate is one of a Si substrate, a SiC substrate and a sapphire substrate.

8. The nitride semiconductor device according to claim 1, wherein the device operation layer includes a GaN layer.

9. The nitride semiconductor device according to claim 1, wherein an AlN layer is provided between the substrate and the first buffer layer.

* * * * *